(12) United States Patent
Ng et al.

(10) Patent No.: US 7,495,929 B2
(45) Date of Patent: Feb. 24, 2009

(54) REFERENCE LAYER OPENINGS

(75) Inventors: Kok-Siang Ng, Penang (MY); King Keong Wong, Kuala Lumpur (MY); Michael E. Ryan, Fountain Hills, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/858,740

(22) Filed: Sep. 20, 2007

(65) Prior Publication Data

US 2008/0006439 A1 Jan. 10, 2008

Related U.S. Application Data

(62) Division of application No. 10/864,958, filed on Jun. 10, 2004, now Pat. No. 7,292,452.

(51) Int. Cl.
  *H05K 7/00* (2006.01)
(52) U.S. Cl. .......... 361/780; 361/794; 361/761; 361/762; 174/255; 174/260; 174/262
(58) Field of Classification Search .......... 361/780, 361/794, 761, 762, 748–751; 174/250, 255, 174/262, 258, 260, 261, 263–266
See application file for complete search history.

(56) References Cited

U.S. PATENT DOCUMENTS

| | | | |
|---|---|---|---|
| 5,418,690 A | 5/1995 | Conn et al. | |
| 6,084,779 A | 7/2000 | Fang | |
| 6,143,990 A | 11/2000 | Kuramochi et al. | |
| 6,179,489 B1 * | 1/2001 | So et al. | 718/102 |
| 6,191,472 B1 | 2/2001 | Mazumder | |
| 6,198,370 B1 * | 3/2001 | Schmitz | 335/256 |
| 6,303,871 B1 * | 10/2001 | Zu et al. | 174/250 |
| 6,372,996 B2 * | 4/2002 | Lin et al. | 174/250 |
| 6,469,256 B1 | 10/2002 | Miller et al. | |
| 6,570,102 B2 | 5/2003 | Miller et al. | |
| 6,613,413 B1 * | 9/2003 | Japp et al. | 428/131 |
| 6,707,685 B2 | 3/2004 | Kabumoto et al. | |
| 6,828,514 B2 | 12/2004 | Chan et al. | |
| 6,891,731 B1 * | 5/2005 | Herrell | 361/777 |
| 2002/0196250 A1 * | 12/2002 | Anderson et al. | 345/420 |
| 2003/0107056 A1 | 6/2003 | Chin et al. | |
| 2003/0127249 A1 * | 7/2003 | Budell et al. | 174/261 |
| 2004/0144562 A1 * | 7/2004 | Ishikawa | 174/255 |
| 2006/0237222 A1 * | 10/2006 | Hosomi et al. | 174/255 |

* cited by examiner

*Primary Examiner*—Dean A. Reichard
*Assistant Examiner*—Hoa C Nguyen
(74) *Attorney, Agent, or Firm*—Schwabe, Williamson & Wyatt, P.C.

(57) ABSTRACT

A component having reference layer openings to contribute towards achieving a differential impedance in a circuit, is described herein.

11 Claims, 5 Drawing Sheets

US 7,495,929 B2

REFERENCE LAYER OPENINGS

CROSS REFERENCE TO RELATED APPLICATIONS

The present application is a divisional of U.S. patent application Ser. No. 10/864,958, filed Jun. 10, 2004, and entitled "REFERENCE LAYER OPENINGS," which is hereby incorporated by reference in its entirety.

TECHNICAL FIELD & BACKGROUND

The present disclosure is related generally to the field of microelectronic devices, and more specifically but not exclusively, to adapting openings in a reference layer to contribute towards achieving a differential impedance in a circuit.

Impedance matching may be a useful design technique for reducing noise or distortion in high-speed applications. During differential signaling on a high-speed bus, for example, an impedance mismatch between package traces and motherboard traces can be a source of distortion and signal loss. Matching impedances may be difficult, however, due to varying effects of different materials in the semiconductor device. In some cases, minimizing trace width and varying trace spacing or geometry within a package substrate layer may be used to achieve a particular matching impedance. Manufacturing capabilities and the high density of semiconductor devices, however, can often limit the effectiveness of such approaches.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION OF ILLUSTRATIVE EMBODIMENTS

Embodiments of the present invention include, but are not limited to, a component having reference layer openings adapted to contribute towards achieving a differential impedance in a circuit, method for making such component, and system for having such component.

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative embodiments. However, it will be apparent to one skilled in the art that embodiments of the present invention may be practiced without the specific details. In other instances, well-known features are omitted or simplified in order not to obscure the illustrative embodiments.

Various operations will be described as multiple discrete operations, in turn, in a manner that is most helpful in understanding the present invention; however, the order of description should not be construed as to imply that these operations are necessarily order dependent. In particular, these operations need not be performed in the order of presentation.

The phrase "in one embodiment" is used repeatedly. The phrase generally does not refer to the same embodiment, however, it may. The terms "comprising", "having" and "including" are synonymous, unless the context dictates otherwise.

For simplicity and clarity of explanation, various embodiments of the invention are shown in the figures according to various views. It is to be appreciated that such views are merely illustrative and are not necessarily drawn to scale or to the exact shape. Furthermore, it is to be appreciated that the actual devices utilizing principles of the invention may vary in shape, size, configuration, contour, and the like, other than what is shown in the figures, due to different manufacturing processes, equipment, design tolerances, or other practical considerations that result in variations from one semiconductor device to another.

Figure 1:
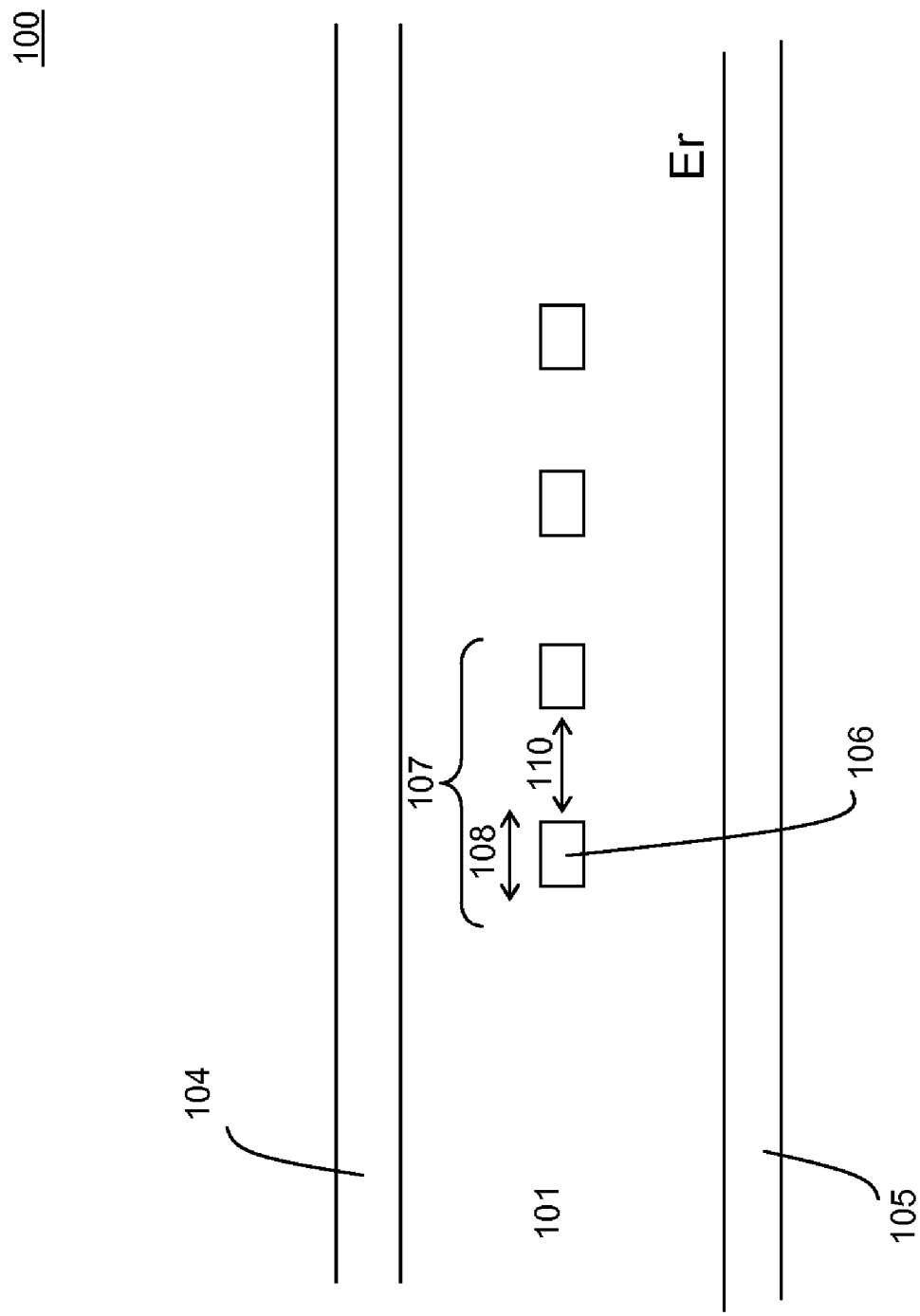
FIG. 1 illustrates a cross-sectional view of a portion of a prior art semiconductor device package.

FIG. 1 illustrates a simplified cross-sectional view of a portion of an example prior art flip chip semiconductor device package. As shown, a substrate of semiconductor device package 100 includes a routing or dielectric layer 101 between an upper ground plane or first reference layer 104 and a lower or second reference layer 105. As illustrated, dielectric layer 101 includes a differential pair 107 of traces 106 to propagate a differential signal. Each trace 106 of differential pair 107 has a trace width 108 and a spacing 110 between each of traces 106. Trace width 108 and spacing 110 may be predetermined by specific packaging technology, manufacturing capabilities or supporting collaterals such as design guidelines, often making it difficult for differential pair 107 of traces 106 to meet a target or particular impedance. As a result, differential signal losses due to impedance mismatch at the package and board level may occur.

Figure 2:
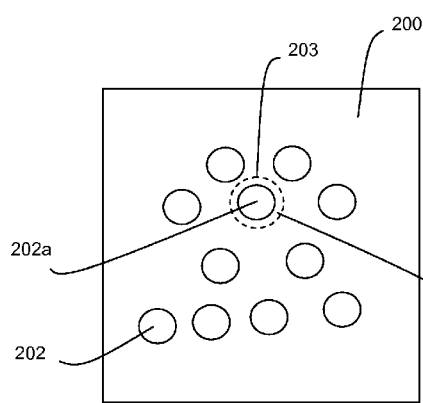
FIG. 2 illustrates a simplified top view of a semiconductor device package surface according to one embodiment.

FIG. 2 illustrates a simplified top view of a semiconductor device package surface according to one embodiment. As illustrated in FIG. 2, for the embodiment, semiconductor device package 200 (hereinafter, "package 200") includes a plurality of holes or openings 202. An enlarged cross-sectional view of indicated portion 203 of package 200 is shown in FIG. 3.

Figure 3:
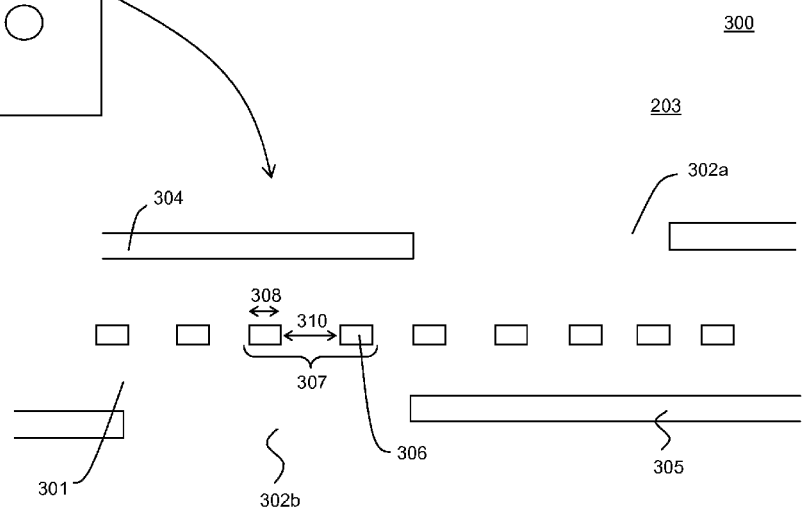
FIG. 3 illustrates a simplified cross-sectional view of the semiconductor device package shown in FIG. 2 according to the embodiment.

According to an embodiment of the invention, FIG. 3 illustrates a package 300 including a differential pair 307 included in a plurality of traces 306 disposed in a routing or dielectric layer 301. Differential pair 307 may include two traces 306 to facilitate propagation of a differential signal. In the embodiment, a first reference layer or reference plane 304 may be disposed on a first or upper side of dielectric layer 301 and may include a plurality of openings 302a. Note that opening 302a is a cross-sectional view of opening 202a from FIG. 2.

As illustrated, a second reference layer or reference plane 305 may be disposed on a second or underside of dielectric layer 301 to include a second plurality of openings 302b (note that only one opening 302a and one opening 302b are shown in this view). For the embodiment, each of plurality of openings 302a in upper reference plane 304 and each of plurality of openings 302b in lower reference plane 305 may be spatially separated horizontally as well as vertically. Thus, in one embodiment, each of plurality of openings 302a may not overlap each of plurality of openings 302b.

Furthermore, for the embodiment, plurality of openings 302a and 302b may be located or adapted within upper and lower reference planes 304 and 305 based in part on a predetermined trace width 308 and a predetermined spacing 310 between each of plurality of traces 306 to contribute towards achieving a particular differential impedance. In various embodiments, the particular differential impedance may be determined based in part on a desired matching impedance. In one embodiment, the particular impedance may be 100 Ohms. In other embodiments, the particular impedance may vary based on various factors, such as, but not limited to, design rules, manufacturing tolerances, number of device layers, plating or solder mask thickness or other design and manufacturing considerations.

Note that upper and lower reference planes, 304 and 305, in an embodiment, may be formed as conductive planes comprised of a conductor such as copper, for example. Thus, in one embodiment, forming plurality of openings 302a and 302b may include reducing a copper plane for an electrical return path of a differential signal to reduce a mutual inductance and a mutual capacitance of at least a pair of traces 307 included in plurality of traces 306 to increase the differential impedance. Furthermore, in one embodiment, a path of each of the plurality of traces 306 may pass underneath or above at least two full openings 302a or 302b (or substantially pass underneath or above an area of openings comparable to traveling underneath or above at least two full openings) to increase a differential impedance during differential signaling. In one embodiment, upper reference plane and lower reference plane 304 and 305 may be included in a flip chip ball grid array (FCBGA) package in the form of a ground plane and a power plane, respectively.

Figure 4:
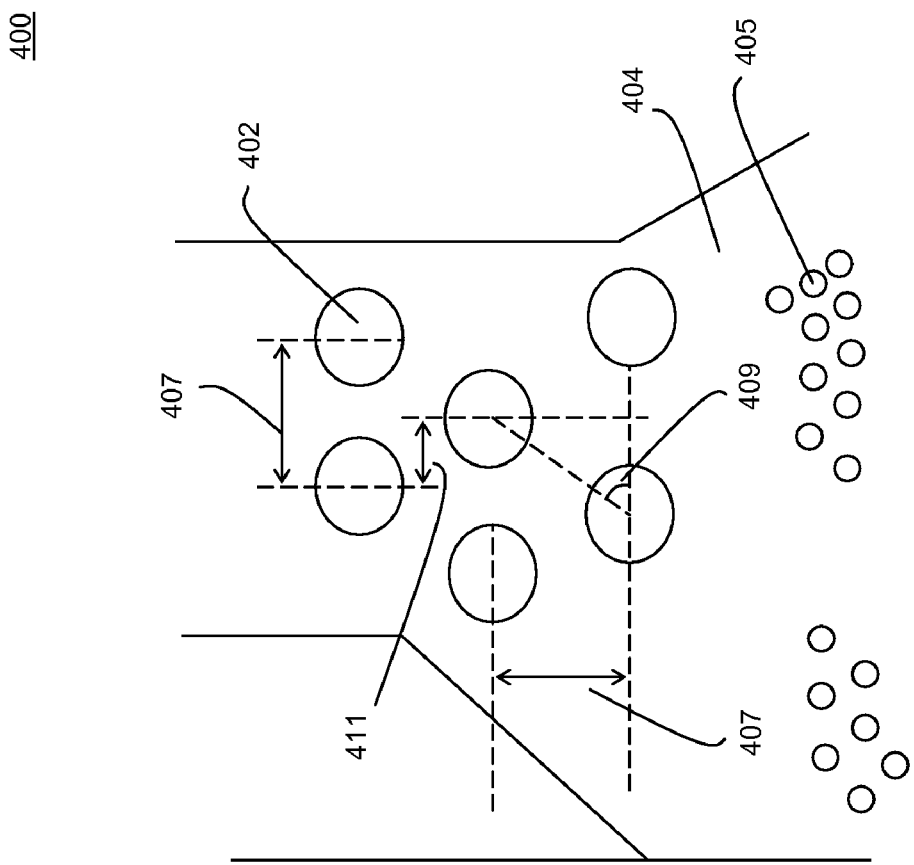
FIG. 4 illustrates a simplified top view of a semiconductor device package layer surface according to another embodiment.

FIG. 4 shows one embodiment of a simplified top view of a surface of a reference layer or plane 404 included in a flip chip semiconductor device package 400. In the illustrated embodiment, reference plane 404 includes a plurality of holes or openings 402. For the embodiment, plurality of openings 402 in reference plane 404 may be formed to have a pitch 407 between each adjacent opening 402 (for clarity, only one opening 402 has been labeled) within a common row or column and an x-y pitch 411 between adjacent rows or columns of openings 402. In one embodiment, pitch 407 may comprise an approximate one millimeter pitch and x-y pitch 411 may comprise an approximate one-half millimeter x-y pitch.

Furthermore, in the embodiment shown, forming plurality of openings 402 in reference plane 404 may include orienting each of the plurality of openings 402 at a particular angle 409 along an x-y plane. In one embodiment, angle 409 along the x-y plane may be an approximate 30-degree angle. Note that in various embodiments, pitch 407, x-y pitch 411 and angle 409 may vary according to various manufacturing capabilities or design tolerances to achieve a desired differential impedance for differential signaling.

Continuing to refer to the embodiment shown in FIG. 4, note that reference plane 404 may include openings having varying diameters. For example, note that for the embodiment, a plurality of openings 405 may have a smaller area or diameter than openings 402. For example, in one embodiment, holes or openings 402 within reference plane 404 may have a diameter of approximately 600-700 microns, while openings 405 located in a breakout region for a routing path of a differential pair may have a relatively smaller diameter such as, for example, approximately 200 microns.

Note that in an alternate embodiment, plurality of openings 402 may be substantially filled with a dummy metal or other material. In one embodiment, filling openings with a metal or other material may facilitate manufacturing processes. Note also, that although openings 402 and 405 may be described or depicted as circular in FIG. 4 and previous figures, openings may be of any suitable shape or size to facilitate achieving a particular differential impedance.

Figure 5:
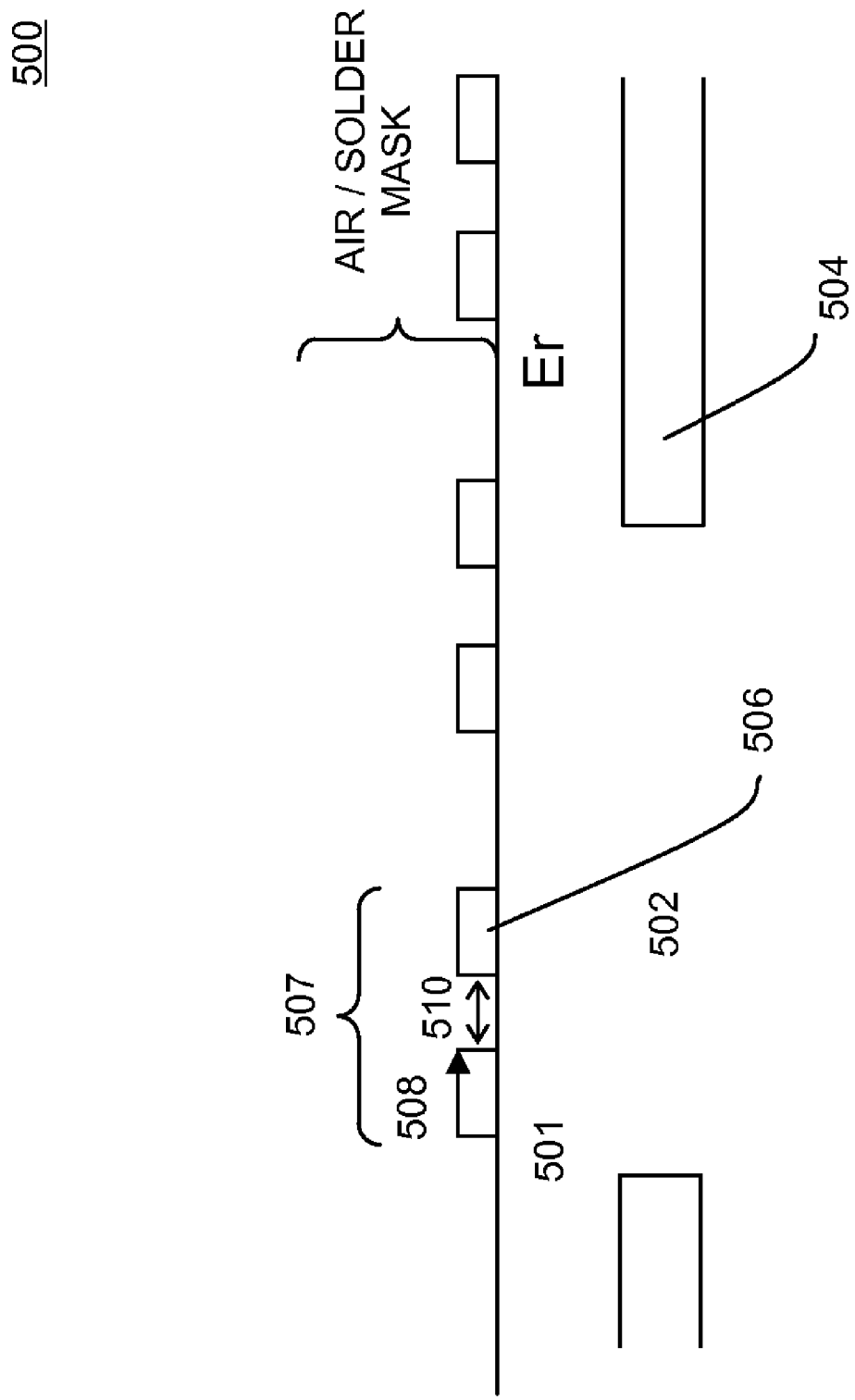
FIG. 5 illustrates a simplified cross-sectional view of a portion of a semiconductor device package according to another embodiment.

FIG. 5 illustrates a cross-sectional view of a package 500 in accordance with an alternate embodiment. Package 500 is similar to package 300 of FIG. 3 with the exception that a pair or traces 507 may be disposed on an upper surface of dielectric layer 501, rather than within dielectric layer 501.

Furthermore, in the illustrated embodiment, package 500 includes a single reference plane or layer 504, rather than two reference planes 304 and 305 as in FIG. 3. In the embodiment, reference layer 504 may be disposed on an underside of dielectric layer 501 and include a plurality of openings 502 adapted based in part on a predetermined width 508 and a predetermined spacing 510 of each of a plurality of traces 506 or pair of traces 507 to contribute in achieving substantially a particular differential impedance. In one embodiment, pair of traces 507 may be included in a plurality of traces 506 disposed on a solder mask in a routing layer of a flip chip ball grid array (FCBGA) package. Thus, in one embodiment, the FCBGA may have a microstrip structure as shown in FIG. 5. In the embodiment, the microstrip structure may allow greater accessibility to pair of traces 506.

Figure 6:
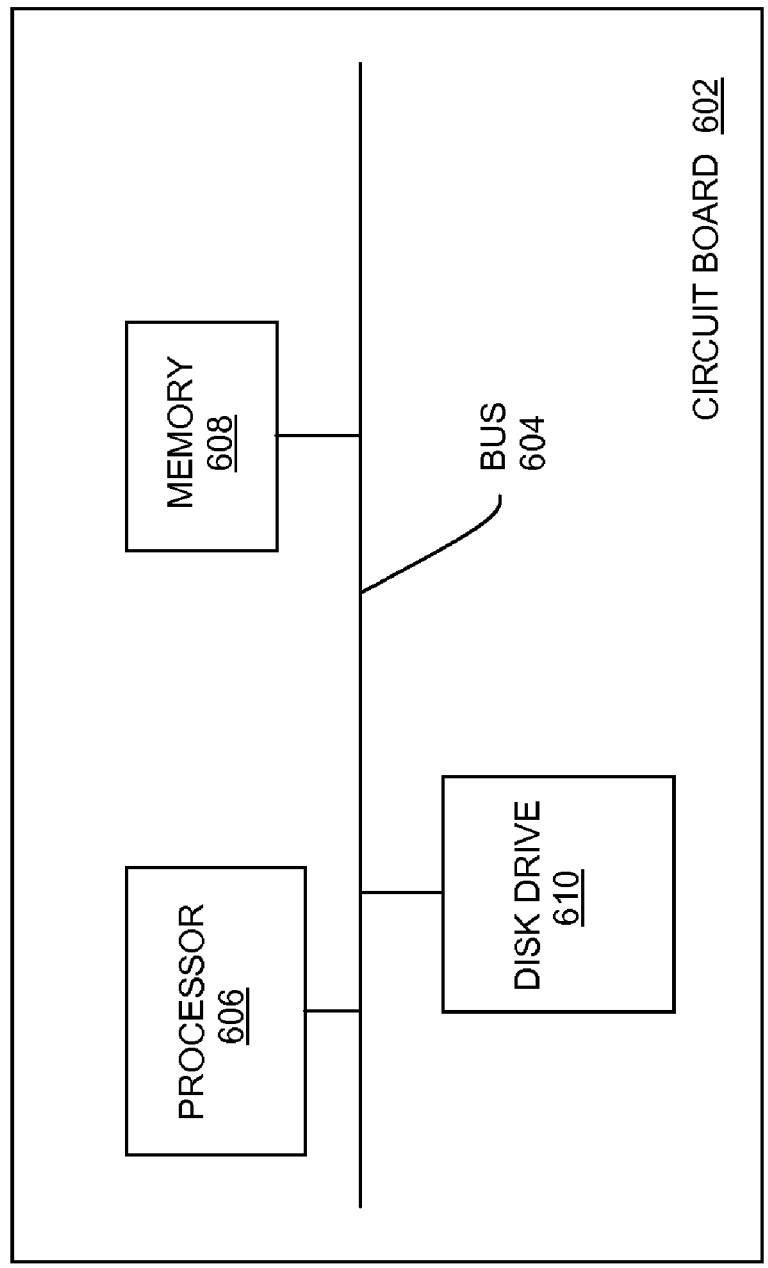
FIG. 6 illustrates a system having a semiconductor device package according to one embodiment.

FIG. 6 illustrates an example routing system in accordance with one embodiment. Example system 600 includes a circuit board 602 including a semiconductor device interface bus 604 to couple a processor 606, a memory 608, and a disk drive 610 to each other as shown. Circuit board 602 may include a dielectric layer such as dielectric layer 301 of FIG. 3, and similarly, a first and a second reference layer such as upper and lower reference planes 304 and 305 disposed, respectively, on a first and a second side of dielectric layer 301. In one embodiment, semiconductor device interface bus 604 may include a plurality of traces 306 disposed in dielectric layer 301, and upper and lower reference planes 304 and 305 may have a plurality of openings 302 complementarily disposed to contribute to achieving a differential impedance for at least a pair of traces of the plurality of traces 306. In one embodiment, plurality of openings 302 in upper reference plane 304 may be arranged in a substantially alternating manner with openings in lower reference plane 305 to achieve a desired differential impedance for differential signaling.

Additionally, while for ease of understanding, processor 606, memory 608 and disk drive 610 are shown as being coupled to a "simple" semiconductor device interface bus 604, in practice, semiconductor device interface bus 604 may comprise multiple bus "segments" bridged by e.g. a semiconductor device interface bus bridge. Note that in various embodiments, semiconductor device interface bus 604 may comprise any suitable interface bus that may use differential pair signaling, such as, for example, but not limited to, a peripheral control interface (PCI) bus, data memory interface (DMI) bus, universal serial bus (USB), serial advanced technology attachment bus (SATA), or other suitable device interface bus.

Further, in alternate embodiments, system 600 may further include other components, such as for example, a compact disk, a digital versatile disk, a video capture unit or an audio rendering unit Thus, it can be seen from the above descriptions, a novel component having reference layer openings adapted to achieve a differential impedance in a semiconductor device, method for making such component, and system for having such component have been described. While the present invention has been described in terms of the foregoing embodiments, those skilled in the art will recognize that the invention is not limited to the embodiments described. The present invention can be practiced with modification and alteration within the spirit and scope of the appended claims.

Thus, the description is to be regarded as illustrative instead of restrictive on the present invention.

What is claimed is:

1. A system, comprising:
   a processor;
   a memory;
   a disk drive; and
   a circuit board including a semiconductor device interface bus to couple the processor, the memory, and the disk drive to each other, the circuit board including a dielectric layer, the semiconductor device interface bus including a plurality of traces disposed in the dielectric layer, and the circuit board further including:
   a first reference layer disposed on a first side of the dielectric layer, the first reference layer including a plurality of openings having a first opening in a breakout region of the first reference layer and a second opening in another region of the first reference layer, a diameter of the first opening being smaller than a diameter of the second opening; and
   a second reference layer disposed on a second side of the dielectric layer, the second reference layer including a second plurality of openings, the first plurality of openings being arranged in a substantially alternating manner with respect to the second plurality of openings, and the first and second plurality of openings being complementarily disposed to contribute to achieving a differential impedance for at least a pair of traces of the plurality of traces.

2. The system of claim 1, further comprising a selected one of compact disk and a digital versatile disk.

3. The system of claim 1, further comprising at least one of a video capture unit and an audio rendering unit.

4. The system of claim 1, wherein the semiconductor device interface bus comprises a selected one of a peripheral control interface bus, data memory interface bus, and universal serial bus.

5. The system of claim 1, wherein the first reference layer is disposed on an upper surface of the dielectric layer and the second reference layer is disposed on a lower surface of the dielectric layer.

6. The system of claim 1, wherein a path of the pair of traces substantially passes underneath or above at least two full openings in one or both of the first reference layer and the second reference layer.

7. The system of claim 1, wherein the first plurality of openings includes at least a first subset disposed in the breakout region and a second subset disposed in the another region, and wherein each of the second subset of the first plurality of openings includes an approximate 1 millimeter pitch between each adjacent opening in the second subset of the first plurality of openings.

8. The system of claim 1, wherein each of the first and second plurality of openings is substantially filled with a metal.

9. The system of claim 1, wherein the differential impedance is approximately 100 ohms.

10. The system of claim 1, wherein the diameter of the second opening is approximately 600-700 microns.

11. The system of claim 1, wherein the diameter of the first opening is approximately 200 microns.

* * * * *

UNITED STATES PATENT AND TRADEMARK OFFICE
CERTIFICATE OF CORRECTION

PATENT NO. : 7,495,929 B2  Page 1 of 1
APPLICATION NO. : 11/858740
DATED : February 24, 2009
INVENTOR(S) : Kok-Siang Ng et al.

It is certified that error appears in the above-identified patent and that said Letters Patent is hereby corrected as shown below:

Column 5
Lines 23-24, "...including a plurality..." should read --...including a first plurality...--.
Lines 24-25, "...brea- kout..." should read --...break- out...--.

Column 6
Lines 20-21, "...brea- kout..." should read --...break- out...--.

Signed and Sealed this

Sixteenth Day of February, 2010

David J. Kappos
*Director of the United States Patent and Trademark Office*